United States Patent [19]

Dunmire et al.

[11] 4,190,106
[45] Feb. 26, 1980

[54] OPTIMIZED COOLER DEWAR

[75] Inventors: Howard L. Dunmire, Woodbridge; Stuart B. Horn, Fairfax, both of Va.

[73] Assignee: The United States of America as represented by the Secretary of the Army, Washington, D.C.

[21] Appl. No.: 668,109

[22] Filed: Mar. 18, 1976

[51] Int. Cl.² .................. F28F 13/00; H01L 23/36; F25B 19/00

[52] U.S. Cl. .................. 165/185; 62/514 R; 250/352; 357/81

[58] Field of Search ............ 165/185; 62/514 R; 250/352; 357/81; 361/381–384, 386

[56] References Cited

U.S. PATENT DOCUMENTS

| 2,805,275 | 9/1957 | Bussing | 165/185 X |
|---|---|---|---|
| 3,387,148 | 6/1968 | Janner et al. | 165/185 X |
| 3,405,272 | 10/1968 | Stevens et al. | 250/352 |
| 3,423,955 | 1/1969 | Wright | 62/514 R |
| 3,586,102 | 6/1971 | Gilles | 165/185 |
| 3,609,992 | 10/1971 | Cacheux | 62/514 R |
| 3,693,374 | 9/1972 | Jauonen et al. | 62/514 R |
| 3,732,421 | 5/1973 | Kunimoto et al. | 250/352 |
| 3,807,188 | 4/1974 | Lagodmos | 62/514 R |
| 3,851,173 | 11/1974 | Taylor et al. | 250/352 X |
| 3,999,403 | 12/1976 | Bower et al. | 165/185 X |

FOREIGN PATENT DOCUMENTS 36251 10/1935 Netherlands ............... 165/185

OTHER PUBLICATIONS

Conductive Elastomeric Connectors, "Tecknit", Technical Wire Products, Inc. Data Sheet FB-320, Mar., 1976, Fuzzbutton Conductive Connector.

Primary Examiner—Sheldon Richter
Attorney, Agent, or Firm—Nathan Edelberg; Robert P. Gibson; John E. Holford

[57] ABSTRACT

The invention provides an elastic interface between a cooler dewar and an electronic cold finger which utilizes multitudinous conduction paths consisting of specialized bent fibers.

8 Claims, 1 Drawing Figure

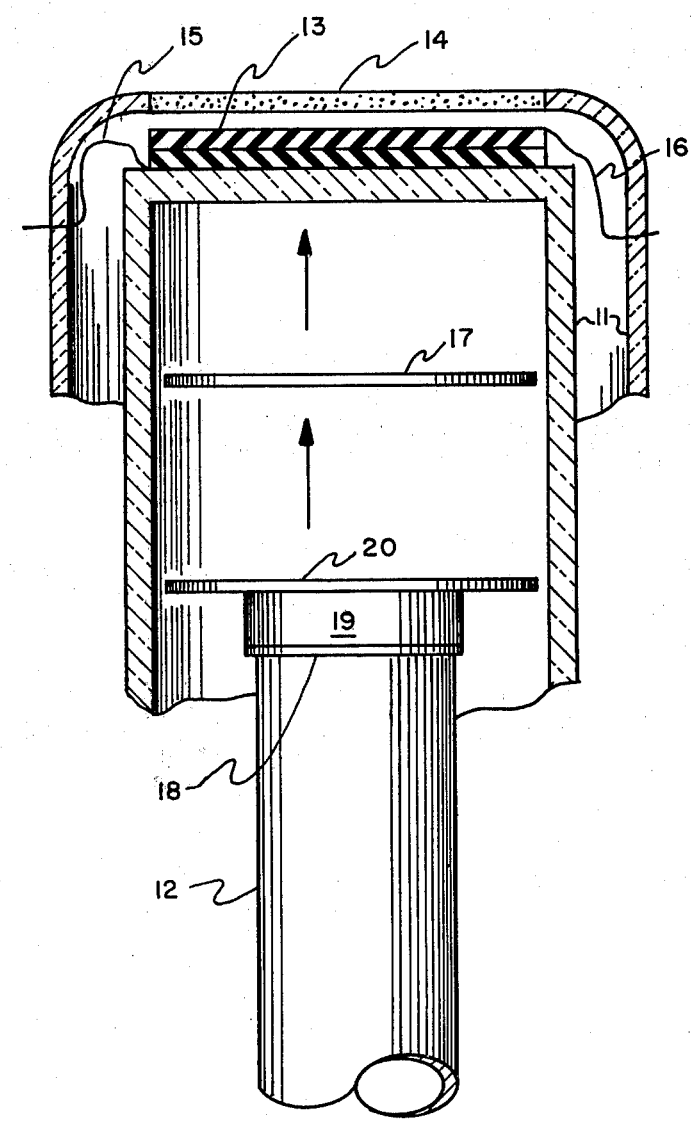

OPTIMIZED COOLER DEWAR

The invention described herein may be manufactured, used, and licensed by or for the Government for governmental purposes without the payment of any royalty thereon.

BACKGROUND OF THE INVENTION

The growth of solid state devices and particularly microelectronics has created a need for specialized types of cooling systems. These devices are very sensitive to temperature variations. Their operation depends on a semiconductor characteristic known as the band gap energy. This is the input energy required to move a charge carrier from the valence band to the conduction band and is manifested by an induced voltage or a change in the electrical impedance of the semiconductor device. Normally this energy is supplied by a photon, or other energy particle, the device is designed to detect. The bandgap is well defined at very low temperatures such as the boiling point of liquid nitrogen but becomes increasingly random at the higher temperatures found in most normal environments. A high performance device thus requires a constant source of cooling during its period of operation.

To stabilize such an electronic device at low temperatures it is common practice to seal it in a vacuum dewar. The device is placed against one inner wall of the dewar and the cold finger of a cooler is pressed against the outside of the same wall directly behind the device. A window for photons is formed by another part of the wall in close spaced proximity to the device. Such a dewar is shown in the U.S. Pat. No. 3,851,173 granted to Carol O. Taylor et al, Nov. 26, 1974.

To provide efficient and stable cooling the cold finger and the dewar must remain in intimate contact through the large temperature excursions encountered in normal operation. Since these two elements are generally made from different materials, i.e. glass and metal, an extensible end portion is usually added to the cold finger to maintain the required contact even through the expansion coefficients of these materials are not equal. These end portions usually consist of a coil spring covered by a sliding cap or extensible bellows. The cooling efficiency is substantially reduced by this arrangement and manufacture or maintenance of the assembly is made more difficult.

BRIEF DESCRIPTION OF THE INVENTION

The present invention overcomes the above difficulties by utilizing a series of highly conductive discs between which are mounted a large number of very small thermal coupling fibers in the extensible end portion. Being small these fibers suffer very little internal stress due to temperature differentials and respond quickly to external stresses to distribute these stresses uniformly among the fibers. The failure of a single fiber due to unavoidable manufacturing limitations or poor subsequent handling has substantially no effect on the remaining fibers in the end portion. The separate fibers are made from a combination of materials in a manner that provides maximum conductivity, elasticity and strength. The fibers are bent and interwoven to provide compressibility and low overall contact resistance, which can be measured analogously in either the thermal or electrical domains.

BRIEF DESCRIPTION OF THE DRAWINGS

The invention is best understood with reference to the drawings wherein applicants' coupling is shown in a preferred embodiment between the cold finger of a cooler and an electronic photon detector.

DESCRIPTION OF PREFERRED EMBODIMENT

The desired thermal coupling in FIG. 1 is between a dewar 11 commonly made from glass or similar frangible material and a cold finger 12 usually made of metal having a low conductivity such as Invar or titanium. The wall of dewar 11, although not shown in its entirety, is continuous and, because of its reentrant nature, defines a double walled annular space and a disc shaped space between its inner and outer round end portions. On the inner end portion within the disc shaped space is mounted a solid state light detector 13. A window 14 is mounted in the outer round end portion of the wall to admit light of the desired frequency to which the detector 13 is sensitive. This window can be designed to reflect other frequencies so as to minimize the temperature rise in the detector. Other parts of the wall can be made as completely reflective as possible for the same reason. The window and the wall of the dewar can also be the same material, in some cases, to simplify manufacture. The dewar wall can also be part metal, but this creates sealing problems which are best avoided, if possible. At least two electrical conductor leads 15 and 16 must be brought out from the detector through the dewar wall as is the usual practice in the vacuum tube art. The tube is evacuated, not for electronic purposes primarily, but to reduce thermal convection of heat to the device 13. When assembled into an optical system the dewar is fixed so that the detector surface will lie in the image plane of the system. The cold finger 12 is part of a cooler which also occupies a fixed position in the system. Thermal expansions of these two otherwise fixed units plus slight vibrations in the cold finger make adequate and safe thermal coupling of the units difficult.

This situation is partially alleviated in applicants' structure by pressing a first transition member comprising a disc 17 of indium against the dewar wall in the cylindrical recess formed behind the detector 13. The interface between glass and indium is the least lossy of known glass-metal combinations. This disc will remain in the place during disassembly because of its malleability and coefficient of thermal expansion, the latter being very close to that of the glass.

The cold finger is provided with a compressible end portion which provides the additional tolerance necessary to maintain proper coupling. A second transition member in the form of a small disc 18 of copper is soldered or welded directly on the end of the cold finger using a bonding material which produces low thermal losses. A third transition member in the form of a cylindrical button 19 composed of compacted interwoven fibers of a material having low conductivity is attached by one of its two circular faces to the exposed face of the small disc. The circular elements 18 and 19 are preferably larger in diameter than the cold finger but substantially smaller than the diameter of the recess provided by the wall of dewar 11. A fourth transition member consisting of a larger copper disc 20 is bonded to the opposite circular face of the cylindrical button using a similar bonding to that used at the small disc. The larger disc is nearly as large as the diameter of the recess being smaller by a sufficient amount to insure an easy sliding fit at any operational temperature (4°–150° K.). Although the copper discs improve the coupling efficiency they could be omitted to provide an even simpler arrangement with the button conductively bonded to either the cold finger or the first transition member. Typical parameters are:

|  | Diameter | Thickness |
|---|---|---|
| Glass Recess | .68 | .045 (wall) |
| Cold Finger | .325 | .030 |
| Small Disc | .36 | .010 |
| Fiber Disc | .36 | .094 (Max) |
| Large Disc | .62 | .010 |

The small disc 18 is spaced from the dewar a distance such that the button is compressed at least 10% of its thickness at any operational temperature.

The fiber button is commercially available under the trade name FUZZ BUTTON. These buttons have been described in DATA SHEET FB-320 August, 1974 distributed by Technical Wire Products, Inc., 129 Dermody Street, Cranford, N.J. These typically are made from 97% copper-3% silver, beryllium copper, monel, steel, substantially pure copper, or brass. Gold, silver and tin platings are available for the copper alloy and steel fibers. Fiber diameters between 0.003 and 0.005 inches are obtainable. Button diameters range from 0.030 to 0.0745 inches and thickness range from 0.030 to 0.750 inches. The fibers are knitted to provide better contact. These buttons exhibit a 200%–300% variation in electrical contact resistance in the first 10% of its compression with less than 10% change expected in the next 2% of total thickness change.

While the invention has been described in combination with an electrical device, wherein it has special advantages, it is understood that it may be used in any combination where a cold finger is applied to a load subject to slight movement and or damage due to thermal stresses. Many variations along these lines will be immediately apparent to those skilled in the art, but the invention is to be limited only as defined in the claims which follow.

We claim:

1. A cryogenic coupling between a cold finger and a low temperature dewar comprising:
   a first planar, solid, highly malleable and highly heat conductive transition member pressed into the surface of said dewar;
   a second highly conductive, thin, rigid, metallic transition member conductively bonded to said cold finger;
   a third transition member comprising a continuous mat of highly heat conductive resilient interwoven fibers filling the major portion of the space between said first and second transition members, said fibers being sufficiently compressed to make firm contact with one another and being bonded to at least one of said transition members; and
   a fourth thin rigid highly conductive metallic interface member is conductively bonded to said third transition member between said first and third transition members.

2. A coupling according to claim 1 wherein said fibers are made of berryllium copper spring wire.

3. A coupling according to claim 1 wherein said fibers are made of an alloy of 97% copper and 3% silver.

4. A coupling according to claim 1 wherein: said fibers are made of brass.

5. A coupling according to claim 1 wherein said fibers have a diameter between 0.003 and 0.005 inches in diameter.

6. A coupling according to claim 1 wherein said third transition member has a thickness between 0.030 and 0.750 inches.

7. A coupling according to claim 1 wherein said first transition member is made of Indium.

8. A coupling according to claim 1 wherein said fourth coupling member is made of copper.

* * * * *